US012646907B2

(12) United States Patent
Gross et al.

(10) Patent No.: US 12,646,907 B2
(45) Date of Patent: Jun. 2, 2026

(54) SOLID STATE POWER SWITCH ASSEMBLY OF AN AIRCRAFT SOLID STATE POWER CONTROLLER AND METHOD OF PROVIDING A SOLID STATE POWER SWITCH ASSEMBLY FOR AN AIRCRAFT SOLID STATE POWER CONTROLLER

(71) Applicant: HS Elektronik Systeme GmbH, Nördlingen (DE)

(72) Inventors: David Gross, Aalen (DE); Stefan Schreitmüller, Auhausen (DE); Tobias Müller, Dürrwangen (DE); Alois Wünsch, Megesheim (DE); Robert Eigner, Harburg (DE); Thomas Gietzold, Unterwilflingen (DE)

(73) Assignee: HS ELEKTRONIK SYSTEME GMBH, Nördlingen (DE)

( * ) Notice: Subject to any disclaimer, the term of this patent is extended or adjusted under 35 U.S.C. 154(b) by 212 days.

(21) Appl. No.: 18/499,727

(22) Filed: Nov. 1, 2023

(65) Prior Publication Data
US 2024/0162690 A1      May 16, 2024

(30) Foreign Application Priority Data
Nov. 10, 2022    (EP) ..................................... 22206693

(51) Int. Cl.
| | |
|---|---|
| *H05K 7/20* | (2006.01) |
| *B64D 31/00* | (2024.01) |

(Continued)

(52) U.S. Cl.
CPC .............. *H02B 1/20* (2013.01); *B64D 31/00* (2013.01); *H05K 1/181* (2013.01); *B64D 2221/00* (2013.01); *H05K 2201/10053* (2013.01)

(58) Field of Classification Search
CPC ...... H02B 1/20; B64D 31/00; B64D 2221/00; H05K 1/181; H05K 2201/10053

(Continued)

(56) References Cited

U.S. PATENT DOCUMENTS

| | | | |
|---|---|---|---|
| 6,081,027 A | * | 6/2000 | Akram ................ H01L 23/4951 |
| | | | 257/E23.092 |
| 6,320,748 B1 | | 11/2001 | Roden et al. |

(Continued)

FOREIGN PATENT DOCUMENTS

| | | |
|---|---|---|
| EP | 1677583 A1 | 7/2006 |
| EP | 3648556 A1 | 5/2020 |

OTHER PUBLICATIONS

European Search Report for Application No. 22206693.8, mailed May 4, 2023, 8 pages.

*Primary Examiner* — Anatoly Vortman
(74) *Attorney, Agent, or Firm* — CANTOR COLBURN LLP

(57) ABSTRACT

A solid state power switch assembly of an aircraft solid state power controller includes a circuit board, at least one solid state power switch, and a busbar. The at least one solid state power switch has a first side and an opposing second side. A power switch electric contact surface is formed on the first side and the at least one solid state power switch is arranged on the circuit board with the second side facing the circuit board and the first side facing away from the circuit board. The busbar comprises at least one busbar contact portion configured for electrically contacting the power switch electric contact surface and at least one busbar mounting portion, which is configured for be mounted to the circuit board, so that the at least one solid state power switch is sandwiched between the at least one busbar contact portion and the circuit board.

16 Claims, 7 Drawing Sheets

(51) Int. Cl.
    *H02B 1/20*             (2006.01)
    *H05K 1/18*             (2026.01)
    *H05K 1/181*          (2026.01)

(58) Field of Classification Search
    USPC ........................................................ 361/624
    See application file for complete search history.

(56)             References Cited

U.S. PATENT DOCUMENTS

| | | | | |
|---|---|---|---|---|
| 6,956,742 | B2 * | 10/2005 | Pfeifer .................. | H02M 7/003 257/E23.098 |
| 7,031,162 | B2 * | 4/2006 | Arvelo ............... | H01L 23/3675 257/713 |
| 7,215,551 | B2 * | 5/2007 | Wang ...................... | H01L 23/42 257/E25.023 |
| 7,746,650 | B2 | 6/2010 | Hellinger et al. | |
| 7,911,798 | B2 * | 3/2011 | Chang .................. | H01L 23/467 361/709 |
| 7,952,856 | B2 * | 5/2011 | Otsuka ............... | H05K 7/14322 361/624 |
| 8,139,371 | B2 * | 3/2012 | Nelson ............... | H05K 7/14322 361/781 |
| 8,680,658 | B2 | 3/2014 | Shi et al. | |
| 9,041,183 | B2 * | 5/2015 | Liang .................. | H01L 23/3735 257/691 |
| 9,106,124 | B2 * | 8/2015 | Bayerer ................ | H02M 7/003 |
| 10,177,085 | B2 * | 1/2019 | Perot ................... | B60R 16/0238 |
| 10,700,043 | B1 | 6/2020 | Sullivan et al. | |
| 10,755,999 | B2 | 8/2020 | Otremba et al. | |
| 10,763,193 | B2 * | 9/2020 | Dickey .................. | H05K 3/303 |
| 11,355,424 | B2 | 6/2022 | Otremba et al. | |
| 11,652,021 | B2 * | 5/2023 | Maier ................. | H01L 23/4334 257/712 |
| 2004/0232545 | A1 * | 11/2004 | Takaishi ............ | H01L 23/49537 257/E23.092 |
| 2005/0135065 | A1 * | 6/2005 | Nakatsu ................ | H01L 25/115 257/E25.026 |
| 2005/0263318 | A1 * | 12/2005 | Yoshioka ............. | H05K 1/0206 174/252 |
| 2006/0018100 | A1 * | 1/2006 | Guo ........................ | H01L 24/49 257/E25.016 |
| 2008/0080151 | A1 | 4/2008 | Shimizu et al. | |
| 2009/0147482 | A1 * | 6/2009 | Katsuro ............. | H05K 7/20854 361/720 |
| 2009/0161318 | A1 | 6/2009 | Sanderson | |
| 2010/0302729 | A1 | 12/2010 | Tegart et al. | |
| 2012/0007535 | A1 * | 1/2012 | Jansson ................. | H02M 7/003 318/558 |
| 2015/0255367 | A1 * | 9/2015 | Nakahara ........... | H10H 20/8581 438/122 |
| 2020/0135622 | A1 * | 4/2020 | Dickey .................. | H01R 43/02 |
| 2020/0357717 | A1 * | 11/2020 | Maier ................. | H01L 23/3675 |
| 2021/0305126 | A1 | 9/2021 | Naeve | |

* cited by examiner

SOLID STATE POWER SWITCH ASSEMBLY OF AN AIRCRAFT SOLID STATE POWER CONTROLLER AND METHOD OF PROVIDING A SOLID STATE POWER SWITCH ASSEMBLY FOR AN AIRCRAFT SOLID STATE POWER CONTROLLER

CROSS REFERENCE TO RELATED APPLICATIONS

This application claims priority to European Patent Application No. 22206693.8 filed Nov. 10, 2022, the entire contents of which is incorporated herein by reference.

TECHNICAL FIELD

The present invention is related to a solid state power switch assembly for an aircraft solid state power controller and to an aircraft solid state power controller comprising such a solid state power switch assembly. The present invention is further related to an aircraft comprising an aircraft solid state power controller and to a method of providing a solid state power switch assembly for an aircraft solid state power controller.

BACKGROUND

Modern aircraft usually comprise at least one aircraft power controller, in particular an aircraft solid state power controller ("SSPC"), for controlling the supply of electric power from an electric power supply to at least one electric load within an aircraft. Aircraft solid state power controllers typically comprise solid state power switches for switching the supply of electric power from the electric power supply to the at least one electric load.

The solid state power switches may heat up in operation, and it may be necessary to dissipate heat from the solid state power switches in order to prevent an overheating of the solid state power switches in operation.

It therefore would be beneficial to provide a solid state power switch assembly for an SSPC, which allows efficiently dissipating heat from the solid state power switches of the solid state power switch assembly, which is generated when the SSPC is operated.

SUMMARY

According to an exemplary embodiment of the invention, a solid state power switch assembly of an aircraft solid state power controller comprises a circuit board, in particular a printed circuit board, at least one solid state power switch and a busbar. The at least one solid state power switch has a first side and an opposing second side. A power switch electric contact surface providing a first electric contact is formed on the first side of the at least one solid state power switch, and the at least one solid state power switch is arranged on the circuit board with the second side facing the circuit board and with the first side facing away from the circuit board. The busbar comprises at least one busbar contact portion, which is configured for electrically contacting the power switch electric contact surface in order to allow transferring electricity and heat between the busbar and the at least one solid state power switch. The busbar further comprises at least one busbar mounting portion, which is to be mounted to the circuit board so that the at least one solid state power switch is sandwiched between the at least one busbar contact portion and the circuit board.

Exemplary embodiments of the invention also include an aircraft solid state power controller comprising at least one solid state power switch assembly according to an exemplary embodiment of the invention, and an aircraft comprising at least one aircraft solid state power controller, which is equipped with at least one solid state power switch assembly according to an exemplary embodiment of the invention.

Exemplary embodiments of the invention further include a method of providing a solid state power switch assembly for an aircraft solid state power controller, wherein the method includes the steps of arranging a solid state power switch having a first side and an opposing second side and a power switch electric contact surface, which is formed on the first side, on a circuit board with the second side facing the circuit board and the first side facing away from the circuit board; arranging a busbar on top of the solid state power switch so that at least one busbar contact portion contacts the power switch electric contact surface of the solid state power switch and the solid state power switch is sandwiched between the busbar and the circuit board; and fixing and electrically connecting at least one busbar mounting portion to at least one corresponding circuit board mounting portion formed on the circuit board.

A solid state power switch assembly according to an exemplary embodiment of the present invention allows simultaneously fixing a busbar to the circuit board, supplying electric currents to the at least one solid state power switch via the busbar, and dissipating heat from the at least one solid state power switch to the busbar via the at least one busbar contact portion.

A large area of contact, as it is provided by contacting the at least one busbar contact portion and the power switch electric contact surface, allows supplying large electric currents with only small electric losses to and from the at least one solid state power switch. It further allows efficiently dissipating a large amount of heat from the at least one solid state power switch.

A solid state power switch assembly according to an exemplary embodiment of the present invention further allows reducing the efforts and costs for manufacturing a solid state power switch assembly, as a busbar according to an exemplary embodiment of the invention is a single element, which fulfills at least three tasks. These tasks include supplying electric energy to the at least one solid state power switch and dissipating heat from the at least one solid state power switch. The busbar further fixes the at least one solid state power switch to the circuit board and provides mechanical protection to the at least one solid state power switch by covering the at least one solid state power switch.

The power switch electric contact surface may be bonded, in particular soldered, to the at least one busbar contact portion. Bonding, in particular soldering, the power switch electric contact surface to the at least one busbar contact portion provides a solid and stable connection between the power switch electric contact surface and the at least one busbar contact portion, which has a low electric and thermal resistance. In consequence, bonding, in particular soldering, the power switch electric contact surface to the at least one busbar contact portion allows for a very efficient transfer of electricity and heat between the at least one solid state power switch and the busbar.

The at least one busbar mounting portion may be electrically connected to an electric contact formed on the circuit board. The electric contact may be electrically connected to an electric path formed on the circuit board. This allows for efficiently transferring electricity to and from the at least one solid state power switch via the circuit board, in particular via electric paths, which are formed on the circuit board.

The at least one busbar mounting portion may be soldered to the electric contact formed on the circuit board. Soldering the at least one busbar mounting portion to the electric contact formed on the circuit board provides a stable and reliable connection between the at least one busbar mounting portion and the electric contact, in particular a connection with a low electric resistance which allows efficiently transferring electric energy between the at least one busbar mounting portion and electric paths formed on the circuit board.

The at least one busbar mounting portion may extend at least partially into and/or through the electric circuitry board. The at least one busbar mounting portion may in particular extend at least partially into and/or through an opening that is formed in the electric circuitry board. A sleeve may be provided in said opening and the at least one busbar mounting portion may extend into and/or through said sleeve. At least one busbar mounting portion extending at least partially into and/or through the electric circuitry board allows for reliably fixing the busbar to the printed circuit board.

The at least one busbar mounting portion may be press fit into the electric circuitry board and/or into the sleeve for fixing the at least one busbar mounting portion to the circuit board.

The at least one busbar mounting portion may comprise a plurality of legs or fingers, which are mounted and/or electrically connected to the electric circuit board. Employing a plurality of legs or fingers may enhance the mechanical and/or electrical connection between the busbar and the electric circuit board.

The busbar may comprise two busbar mounting portions. The two busbar mounting portions may be formed on opposite ends of the busbar. Such a configuration allows for a symmetric and very stable mechanical connection between the busbar and the circuit board. It further allows distributing electric currents, which are supplied to the at least one solid state power switch, over two opposite ends of the busbar. This may allow for a uniform distribution of the electric currents and to avoid "hot spots" on the circuit board.

The at least one busbar contact portion may form a bridge extending in a longitudinal direction between the two busbar mounting portions over the at least one solid state power switch. This may allow for efficiently contacting the at least one solid state power switch to the at least one busbar contact portion. It may further allow the at least one busbar contact portion to mechanically cover and protect the at least one solid state power switch.

The solid state power switch assembly may comprise a plurality of solid state power switches and a single busbar, wherein the power switch electric contact surfaces of the plurality of solid state power switches electrically contact the at least one busbar contact portion of the single busbar. In other words, a single busbar may be used for contacting a plurality of solid state power switches for supplying electric energy to and dissipating heat from the plurality of solid state power switches. Employing a single busbar for contacting a plurality of solid state power switches reduces the efforts and costs for manufacturing and assembling the solid state power switch assembly.

The plurality of solid state power switches may be arranged along a linear row of solid state power switches. Solid state power switches, which are arranged along a linear row, may be easily contacted with a busbar contact portion of the single busbar, which extends linearly parallel to the linear row of solid state power switches. The plurality of solid state power switches may be arranged in other patterns as well.

The solid state power switch assembly may comprise a plurality of solid state power switches and a plurality of busbars, wherein the power switch electric contact surfaces of the plurality of solid state power switches electrically contact busbar contact portions of different busbars. A configuration comprising a plurality of busbars allows distributing the electric currents flowing to and from the plurality of solid state power switches and the heat, which is dissipated from the plurality of solid state power switches, over a plurality of busbars, thereby reducing the electric and thermal load on each of the busbars.

Each busbar may comprise a plurality of cooling fins. The cooling fins may in particular extend from the at least one busbar contact portion in a direction facing away from the circuit board for allowing cooling air to circulate around the cooling fins. Providing such cooling fins may enhance the cooling capacity of the busbar.

The busbar may be made of metal, for example aluminum or copper, having a high electric and thermal conductivity and providing a high cooling capacity. The busbar may in particular be made from a sheet of metal, which is cut and bent into the desired shape.

The busbar may also be formed by stamping, punching, etching, drilling, machining or any other forms of metal forming.

A busbar made of metal may have an applied surface finish of one or more layers of metal applied by chemical or physical deposition techniques. The applied surface finish may enhance the soldering bonding or gluing of the busbar to the power switch and/or circuit board and protect the busbar against corrosion.

The at least one solid state power switch may additionally comprise second and third electric contacts. The second and third electric contacts may extend laterally from the at least one solid state power switch, the second and third electric contacts may in particular extend transversely to a longitudinal extension of the busbar mounting portion. Such a configuration allows contacting the second and third electric contacts to the circuit board next to the busbar. In such a configuration, access to the second and third electric contacts is not blocked by the busbar mounting portion.

BRIEF DESCRIPTION OF THE FIGURES

In the following, an exemplary embodiment of the invention is described in more detail with reference to the enclosed figures in which.

DETAILED DESCRIPTION

Figure 1:
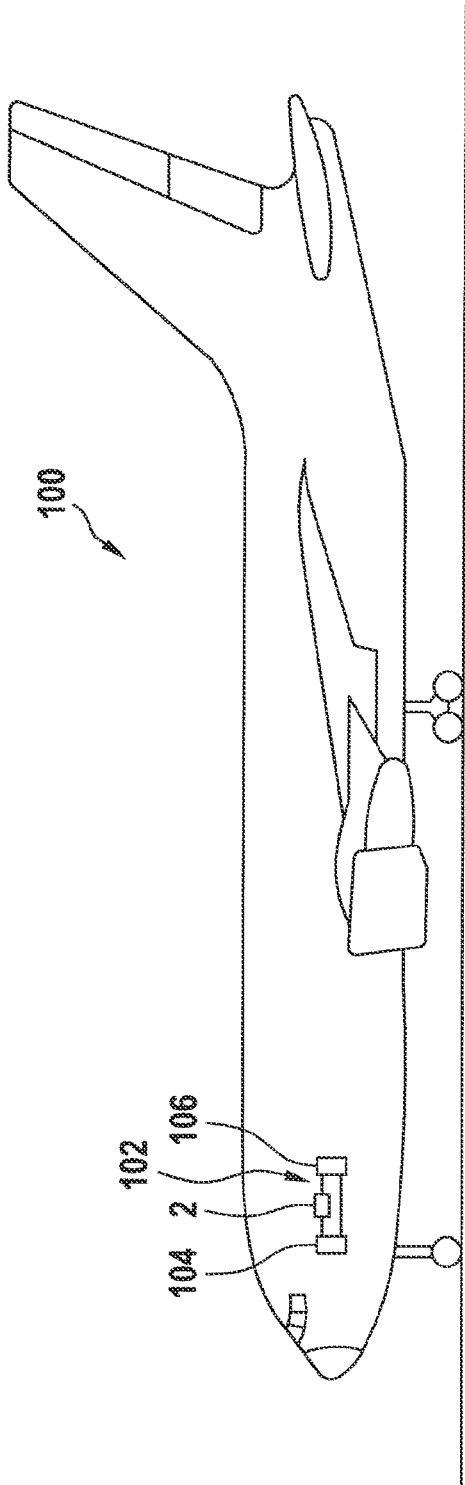
FIG. 1 depicts an aircraft with an electric circuit comprising an aircraft solid state power controller according to an exemplary embodiment of the invention.

FIG. 1 shows an aircraft 100, in particular an airplane, which is equipped with an aircraft electric power supply system 102 including an aircraft electric power supply 104, an electric load 106, and an aircraft solid state power controller (SSPC) 2 according to an exemplary embodiment of the invention, which is configured for controlling the supply of electric power from the aircraft electric power supply 104 to the electric load 106.

Although the aircraft electric power supply system 102 depicted in FIG. 1 includes only a single aircraft electric power supply 104, a single electric load 106, and a single SSPC 2, respectively, alternative embodiments of aircraft electric power supply system 102 may comprise more the one of each of said components, respectively.

An aircraft electric power supply system 102 may in particular include a plurality of SSPCs 2, wherein each SSPC 2 includes numerous SSPC channels.

Figure 2:
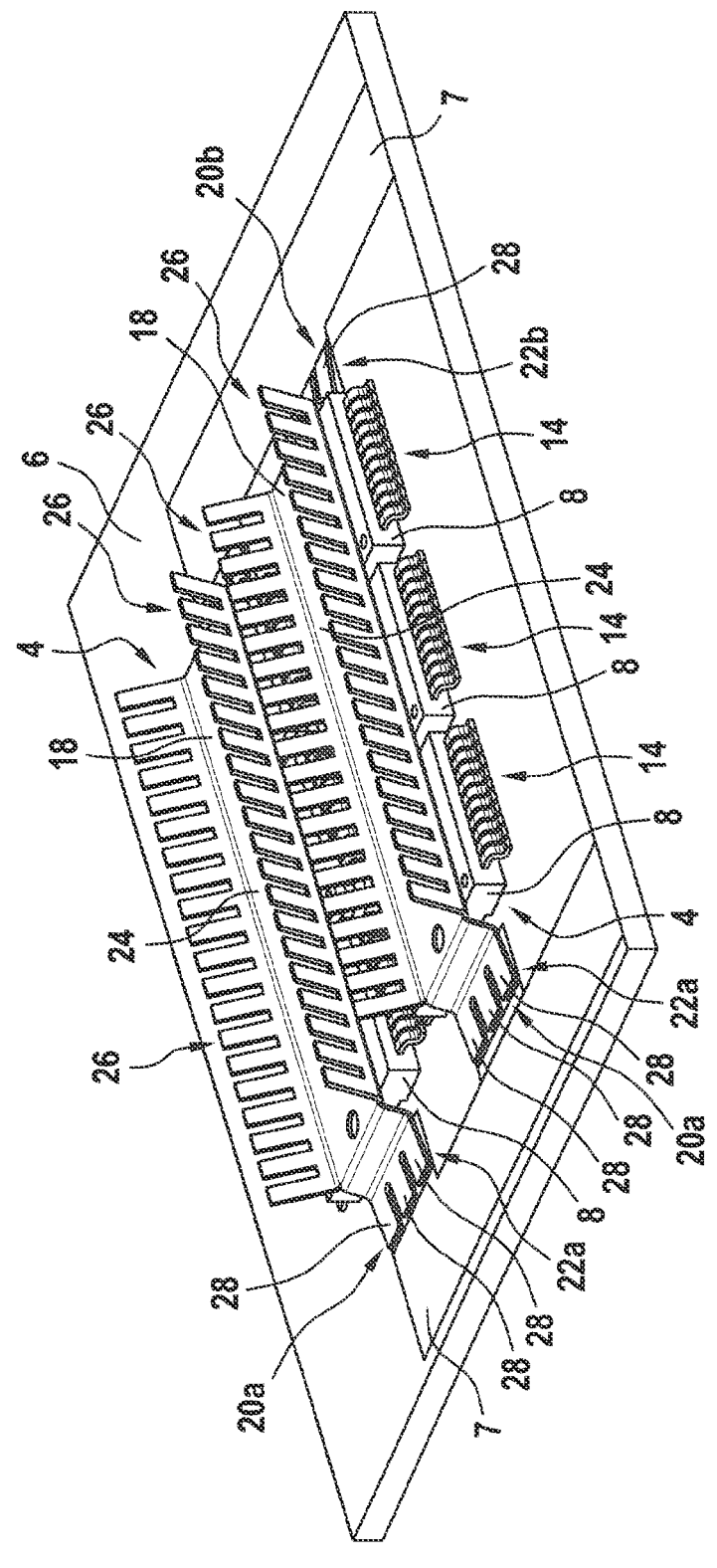
FIG. 2 shows a perspective view of a circuit board supporting two solid state power switch assemblies of an aircraft solid state power controller according to an exemplary embodiments of the invention.

FIG. 2 shows a perspective view of a circuit board 6 supporting two solid state power switch assemblies 4 of an aircraft solid state power controller 2 according to an exemplary embodiments of the invention.

Figure 3:
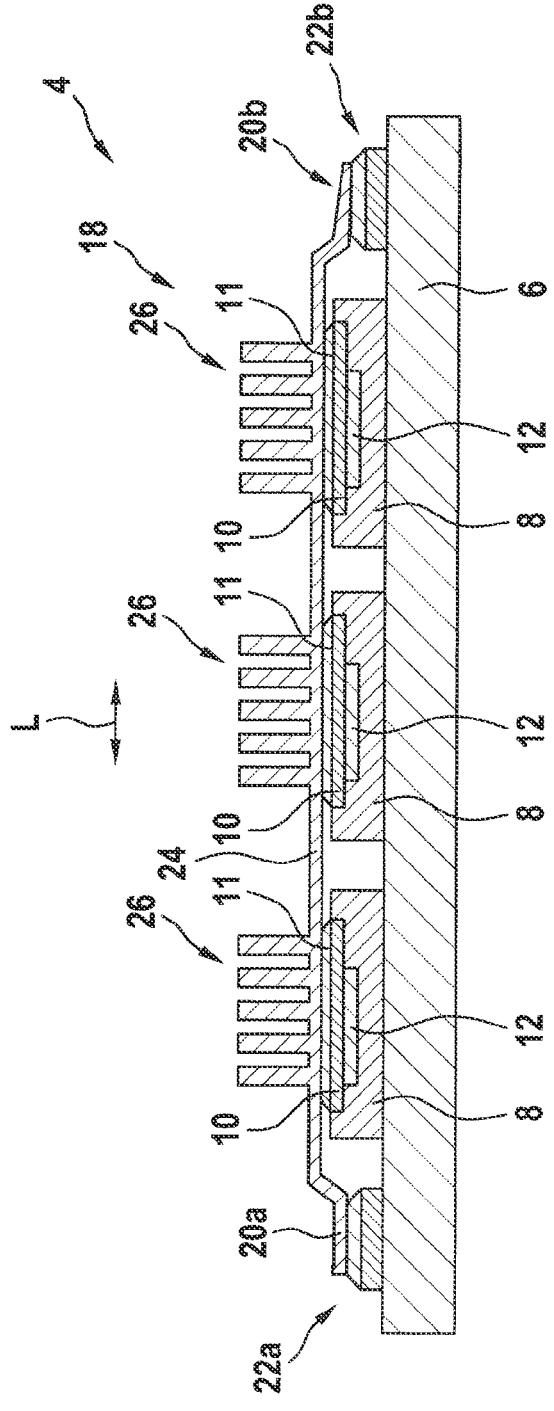
FIG. 3 shows a sectional side view through a solid state power switch assembly of an aircraft solid state power controller according to an exemplary embodiment of the invention.

FIG. 3 shows a sectional side view through a solid state power switch assembly 4 of an aircraft solid state power controller 2 according to an exemplary embodiment of the invention. The circuit board 6 may be a printed circuit board.

Each of the solid state power switch assemblies 4 depicted in FIGS. 2 and 3 comprises three solid state power switches 8. The solid state power switches 8 are supported by the circuit board 6.

In the embodiment depicted in FIGS. 2 and 3, the three solid state power switches 8 are arranged next two each other along a straight line forming a row of solid state power switches 8. The number of three solid state power switches 8 depicted in FIGS. 2 and 3 is only exemplary. A solid state power switch assembly 4 according to an exemplary embodiment of the invention may also comprise one, two or more than three solid state power switches 8, and the solid state power switches 8 may be arranged in other geometric arrangements than linear rows. The solid state power switches 8 may, for example, be arranged in a two-dimensional matrix configuration.

Figure 4:
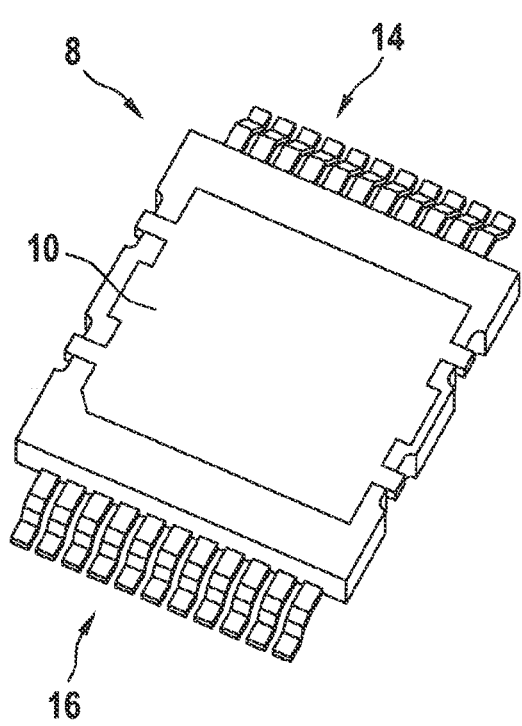
FIG. 4 shows a top view of an example of a solid state power switch according to an exemplary embodiment of the invention.
Figure 5:
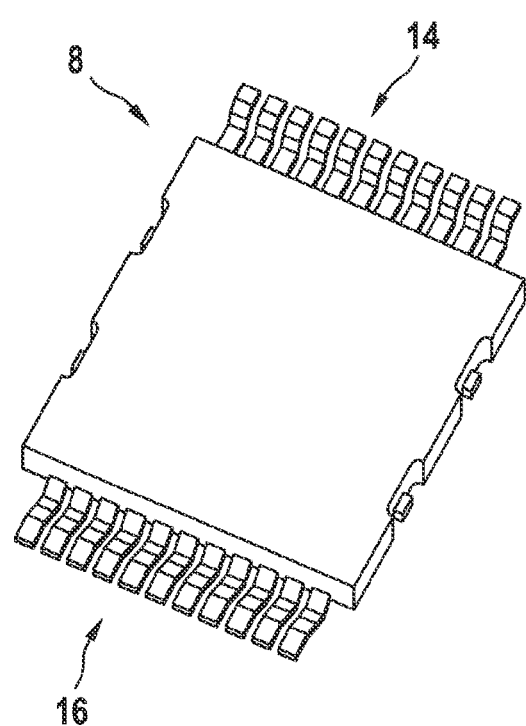
FIG. 5 shows a bottom view of an example of a solid state power switch according to an exemplary embodiment of the invention.

FIGS. 4 and 5 show a top view and a bottom view of an example of a solid state power switch 8, as it may be employed in a solid state power switch assembly 4 according to an exemplary embodiment of the invention.

The solid state power switch 8 has a first side, which is shown in FIG. 4, and an opposing second side, which is shown in FIG. 5.

As shown in FIG. 4, a power switch electric contact surface 10 is formed on the first side of the solid state power switch 8. The power switch electric contact surface 10 is internally electrically connected to a semiconductor 12, which is provided within the solid state power switch 8 (see FIG. 3). The power switch electric contact surface 10 may in particular be electrically connected to the source of at least one field effect transistor, which is provided by the semiconductor 12 within the solid state power switch 8.

The solid state power switch 8 further comprises second and third electric contacts 14, 16 extending laterally from the at least one solid state power switch 8. The second and third electric contacts 14, 16 are electrically connected to the semiconductor 12 provided within the solid state power switch 8 as well. The second and third electric contacts 14, 16 may in particular be electrically connected to other portions of the semiconductor 12 than the power switch electric contact surface 10. The second and third electric contacts 14, 16 may for example be electrically connected to portions of the semiconductor 12 that form a drain and a gate of at least one field effect transistor provided by the semiconductor 12.

The numbers and the shapes of the second and third electric contacts 14, 16 depicted in FIGS. 4 and 5 are only exemplary. They may differ depending on the specific type of solid state power switch 8.

Figure 6:
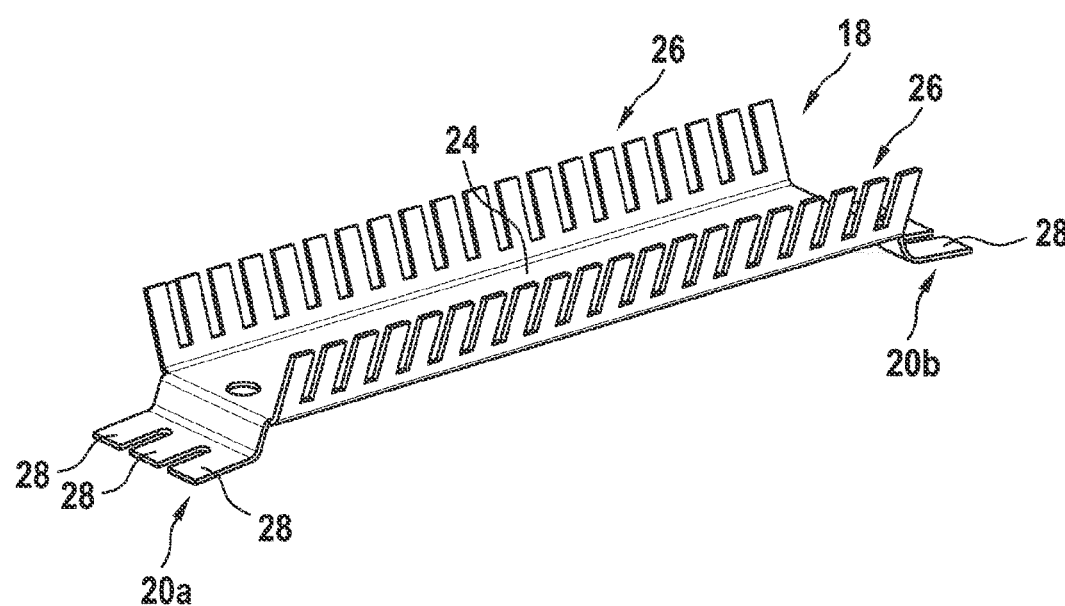
FIG. 6 shows a perspective view of a busbar according to an exemplary embodiment of the invention.

The solid state power switch assembly 4 further comprises a busbar 18 extending over the solid state power switches 8. An exemplary embodiment such a busbar is depicted in FIG. 6.

The busbar 18 may be made from metal, such as aluminum or copper. The busbar 18 may in particular be made from a sheet of metal, which is cut and bent into the desired shape.

The busbar 18 comprises two busbar mounting portions 20a, 20b, which are formed on opposing ends of the busbar 18. The two busbar mounting portions 20a, 20b are mounted and electrically connected to corresponding circuit board mounting portions 22a, 22b, which are formed on the circuit board 6. The circuit board mounting portions 22a, 22b may be electrically conductive for electrically connecting the busbar 18 with electrically conductive paths 7 formed on the circuit board 6.

The busbar 18 further comprises a busbar contact portion 24, which is formed as a bridge extending along a longitudinal direction L between the busbar mounting portions 20a, 20b over the solid state power switches 8 so that the solid state power switches 8 are sandwiched between the busbar contact portion 24 and the circuit board 6.

The solid state power switches 8 are arranged on the circuit board 6 with their second sides facing the circuit board 6 and with their first sides, which include the power switch electric contact surfaces 10, facing the busbar 18. (See FIGS. 2 and 3.)

The power switch electric contact surfaces 10 are electrically contacted with the busbar contact portion 24. As a result, the busbar 18 electrically connects the power switch electric contact surfaces 10 of the solid state power switches 8 with the electrically conductive paths 7 formed on the circuit board 6.

The power switch electric contact surfaces 10 may be bonded to the at least one busbar contact portion 24 using an electrically and thermally conducting bonding material 11. The power switch electric contact surfaces 10 may for example be soldered to the at least one busbar contact portion 24. Alternatively, the power switch electric contact surfaces 10 may be bonded to the at least one busbar contact portion 24 using an electrically and thermally conducting glue.

Electrically contacting the power switch electric contact surfaces 10 of the solid state power switches 8 to the busbar contact portion 24 according to exemplary embodiments of the invention allows using the busbar 18 for efficiently supplying electric energy to the solid state power switches 8 and for efficiently dissipating heat, which is generated when the solid state power switches 8 are operated, from the solid state power switches 8.

For enhancing the dissipation of heat from the solid state power switches 8 even further, the busbar 18 may comprise a plurality of cooling fins 26, in particular cooling fins 26 which extend from the at least one busbar contact portion 24 in a direction facing away from the circuit board 6 for allowing the circulation of cooling air around the plurality of cooling fins 26.

In the embodiment depicted in FIGS. 2 and 6 each of busbar mounting portions 20a, 20b comprises three legs or fingers 28. The legs or fingers 28 extend parallel to each other in the longitudinal direction L and they may be soldered to the corresponding circuit board mounting portions 22a, 22b.

The number of three legs or fingers 28 is only exemplary. The busbar mounting portions 20a, 20b may comprise fewer or more than three legs or fingers 28, which are mounted to the circuit board 6. At least some of legs or fingers 28 may extend transversely or diagonally to the longitudinal direction L.

Figure 7:
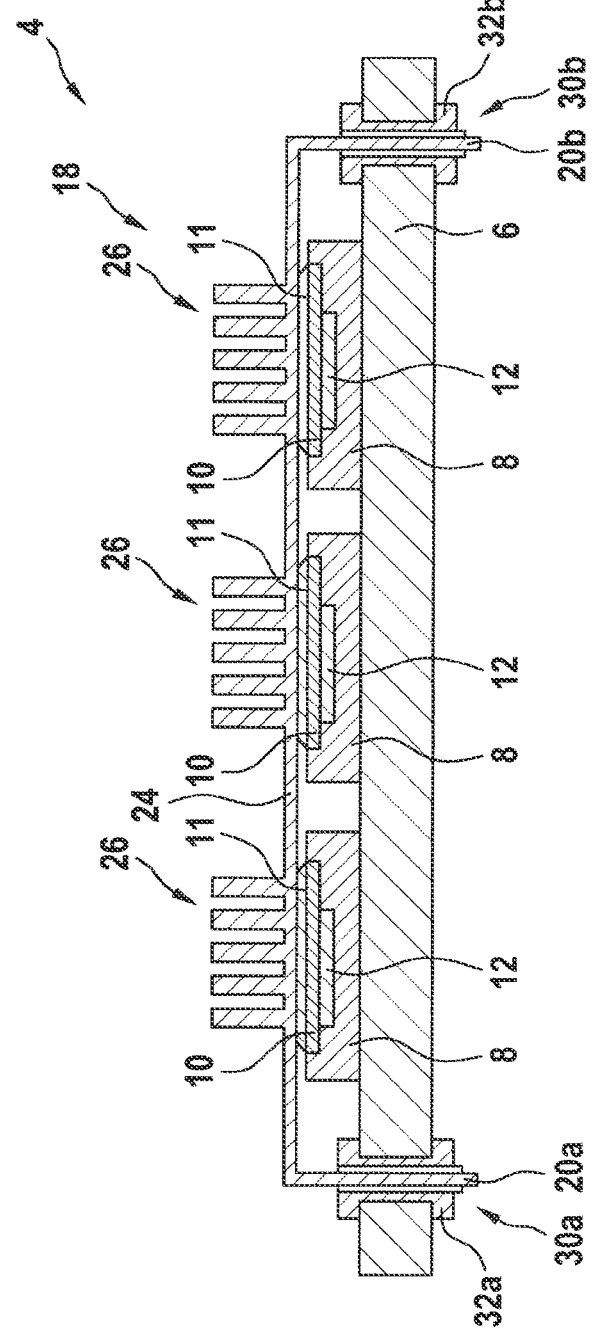
FIG. 7 shows a sectional view of an embodiment, in which the busbar mounting portions of the busbar extend into openings formed within the circuit board.
Figure 8:
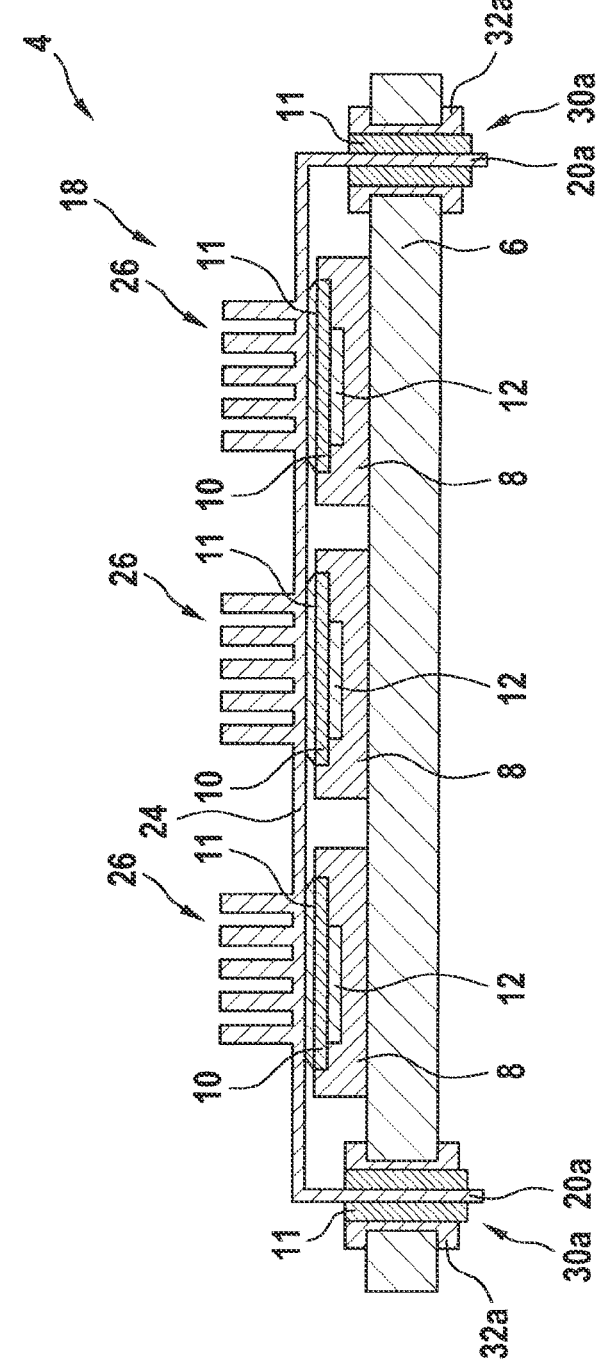
FIG. 8 shows a sectional view of another embodiment, in which the busbar mounting portions of the busbar extend into openings formed within the circuit board.

In alternative embodiments, which are depicted in FIGS. 7 and 8, the busbar mounting portions 20a, 20b extend into and/or through openings 30a, 30b formed within the circuit board 6. The components, which are basically identical with the components of the embodiment depicted in FIGS. 2 to 6 are denoted with the same reference signs and will not be discussed in detail again. The description of FIGS. 2 to 6 applies to these components as well.

FIG. 7 depicts a sectional view of an exemplary embodiment, in which the busbar mounting portions 20a, 20b are press-fit into sleeves 32a, 32b, which are installed in the openings 30a, 30b formed within the circuit board 6 for securely fixing the busbar 18 to the circuit board 6 and for providing an electrical connection between the busbar mounting portions 20a, 20b and the corresponding circuit board mounting portions 22a, 22b, which has a low electric resistance.

FIG. 8 depicts a sectional view of an alternative exemplary embodiment, in which the busbar mounting portions 20a, 20b are soldered or glued with an electrically and thermally conducting bonding material 11 into the sleeves 32a, 32b, which are installed in the openings 30a, 30b formed within the circuit board 6 for securely fixing the busbar 18 to the circuit board 6 and for providing an electrical connection between the busbar mounting portions 20a, 20b and corresponding circuit board mounting portions 22a, 22b, which has a low electric resistance.

While the invention has been described with reference to an exemplary embodiment, it will be understood by those skilled in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention is not limited to the particular embodiment disclosed, but that the invention will include all embodiments falling within the scope of the appended claims.

The invention claimed is:

1. Solid state power switch assembly of an aircraft solid state power controller comprising:
   a printed circuit board;
   at least one solid state power switch having a first side and an opposing second side, with a power switch electric contact surface formed on the first side and providing a first electric contact internally electrically connected to a semiconductor, which is provided within the solid state power switch, wherein the at least one solid state power switch is arranged on the circuit board with the second side facing the circuit board and with the first side facing away from the circuit board; and
   a busbar comprising:
      at least one busbar contact electrically contacting the power switch electric contact; and
      at least one busbar mounting portion mounted to the circuit board so that the at least one solid state power switch is sandwiched between the at least one busbar contact portion and the circuit board.

2. A solid state power switch assembly according to claim 1, wherein the power switch electric contact surface is bonded to the at least one busbar contact portion.

3. A solid state power switch assembly according to claim 1, wherein the at least one busbar mounting portion is electrically connected to a corresponding circuit board mounting portion formed on the circuit board, wherein the portion is an electrically conductive path formed on the circuit board.

4. A solid state power switch assembly according to claim 3, wherein the at least one busbar mounting portion is soldered to the corresponding circuit board mounting portion.

5. A solid state power switch assembly according to claim 1, wherein the at least one busbar mounting portion extends at least partially into or through the printed circuit board, wherein the at least one busbar mounting portion is press fit into an opening or sleeve provided in the printed circuit board.

6. A solid state power switch assembly according to claim 1, wherein the busbar is at least partially made of metal, wherein the busbar has an applied surface finish of one or more layers of metal applied by chemical or physical deposition techniques.

7. A solid state power switch assembly according to claim 1, wherein the at least one busbar mounting portion comprises a plurality of legs or fingers, which are mounted and/or electrically connected to the electric circuit board.

8. A solid state power switch assembly according to claim 1, wherein the busbar comprises two busbar mounting portions, which are formed on opposite ends of the busbar, and wherein the at least one busbar contact portion forms a bridge extending along a longitudinal direction between the two busbar mounting portions.

9. A solid state power switch assembly according to claim 1, wherein the at least one solid state power switch includes a plurality of solid state power switches and the bus bar is a single busbar; and
   wherein the power switch electric contact surfaces of the plurality of solid state power switches electrically contact the at least one busbar contact portion of the single busbar, wherein the plurality of solid state power switches are along a linear row of solid state power switches.

10. A solid state power switch assembly according to claim 1, wherein the at least one solid state power switch includes a plurality of solid state power switches and the bus bar is a plurality of busbars; and
   wherein the power switch electric contact surface of each of the plurality of solid state power switches electrically contacts at least one busbar contact portion of one of the plurality of busbars.

11. A solid state power switch assembly according to claim 1, wherein the busbar comprises a plurality of cooling fins, wherein the cooling fins extend from the at least one busbar contact portion in a direction facing away from the circuit board.

12. A solid state power switch assembly according to claim 1, wherein the at least one solid state power switch comprises second and third electric contacts extending laterally from the at least one solid state power switch, wherein the second and third electric contacts extend transversely to a longitudinal extension of the busbar mounting portion.

13. An aircraft solid state power controller comprising:

at least one solid state power switch assembly according to claim 1.

14. An aircraft comprising:

at least one aircraft solid state power controller according to claim 13.

15. A solid state power switch assembly according to claim 1, wherein the busbar transfers electricity and heat between the busbar and the at least one solid state power switch.

16. A method of providing a solid state power switch assembly of an aircraft solid state power controller, the method comprising:

arranging a solid state power switch having a first side and an opposing second side and a power switch electric contact surface, which is formed on the first side and which provides an electric contact internally electrically connected to a semiconductor, which is provided within the solid state power switch, on a circuit board with the second side facing the circuit board and the first side facing away from the circuit board;

arranging a busbar on top of the solid state power switch so that at least one busbar contact portion contacts the power switch electric contact surface of the solid state power switch and the solid state power switch is sandwiched between the busbar and the circuit board; and fixing and electrically connecting at least one busbar mounting portion to at least one corresponding circuit board mounting portion formed on the circuit board.

\* \* \* \* \*